United States Patent [19]
Iijima et al.

[11] Patent Number: 5,286,329
[45] Date of Patent: Feb. 15, 1994

[54] TAPE-ON-WAFER MOUNTING APPARATUS AND METHOD

[75] Inventors: Nobuo Iijima; Akihisa Hayashida, both of Kawasaki, Japan

[73] Assignee: Fujitsu Limited, Kanagawa, Japan

[21] Appl. No.: 28,551

[22] Filed: Mar. 8, 1993

[30] Foreign Application Priority Data

Mar. 13, 1992 [JP] Japan .................................. 4-054031

[51] Int. Cl.$^5$ .............................................. B32B 31/00
[52] U.S. Cl. ..................................... 156/297; 156/299; 156/580; 156/583.3; 100/211; 100/299
[58] Field of Search ............... 156/475, 493, 212, 580, 156/401, 412, 488, 583.3; 100/211

Primary Examiner—David A. Simmons
Assistant Examiner—M. Curtis Mayes
Attorney, Agent, or Firm—Nikaido, Marmelstein, Murray & Oram

[57] ABSTRACT

A tape-on-wafer mounting apparatus and method for mounting a dicing tape on a wafer. The wafer stage mounts a wafer in the hole, which is constructed such that, when the wafer is mounted there, the wafer top surface stands higher than the wafer stage surface, with the wafer surface on which chip circuits are fabricated faced down. The tape stage mounts a dicing tape on its ring with the tape surface on which adhesives are applied faced down. The tape pressing tool presses the tape stage on the wafer stage so that the tape presser, which is constructed such that vertical force exerted by it is the largest at its center and smaller with the increase in distance from the center, causes the dicing tape to stick to the wafer.

10 Claims, 4 Drawing Sheets

TAPE-ON-WAFER MOUNTING APPARATUS AND METHOD

BACKGROUND OF THE INVENTION

1. Field of the Invention

The present invention relates to a tape-on-wafer mounting apparatus and method for mounting a dicing tape on a semiconductor wafer (hereinafter simply called a wafer) before the wafer is divided into chips (or diced).

The process for manufacturing semiconductor devices includes a process in which a wafer having a plurality of chip circuits arranged on an entire surface thereof, is divided into a plurality of chips or diced.

When a wafer is diced, a method generally used to prevent chips diced from getting scattered and lost or even damaged due to a collision with each other, is to mount or stick a dicing tape on the entire surface of the wafer's back and then to cut the wafer to a depth where the dicing tape is not cut through. However, as a wafer becomes large-sized, the wafer becomes liable to bend due to its own weight and it becomes difficult to mount the dicing tape uniformly and firmly on the wafer. Accordingly, a dicing tape-on-wafer mounting apparatus and method for mounting a dicing tape on a semiconductor wafer uniformly and firmly on the wafer, is in great demand.

2. Description of the Related Art

FIG. 1 (a)–(c) illustrate a technical background of the present invention, each showing a wafer before dicing, in the process of dicing and after diced, respectively.

In FIG. 1 (a), a round wafer 1 has a plurality of chip elements 11 including chip circuits 11a, arranged on an entire surface (on the top side in the Figure) of the wafer 1. If the wafer 1 is diced into chip elements 11 as it is, the chip elements 11 diced may scatter or collide with each other, causing some of them to be lost or damaged in circuit function.

To prevent this, firstly a dicing tape 12, which is large enough to cover the wafer 1, is mounted (or stuck) on the back (the bottom side in the Figure) of the wafer 1 on which chip circuits 11a are not fabricated, as shown by an arrow. Secondly, the wafer 1 is grooved in a gridiron layout between the chip elements 11 by using a circular saw 13, to the depth of its thickness but where the dicing tape 12 is not cut through, as shown in FIG. 2 (b). The dicing tape 12 is made of polyethylene, for example, and has an adhesive 12a having a property to lose viscosity when irradiated by ultraviolet rays, applied on one side (the top side of the tape in the Figure).

Since the chip elements 11 diced are stuck to the dicing tape 12 as they are arranged in order as shown in FIG. 1 (c), they will never scatter or collide with each other, which facilitates reservation and transfer of them. Accordingly, the chip elements 11 diced can easily be peeled off and separated from the dicing tape 12 by irradiating ultraviolet rays on the entire surface of the wafer 1, as required.

FIG. 2 (a)–(b) show an example of a conventional dicing tape-on-wafer mounting apparatus and method. FIG. 2 (a) is a schematic sectional view of a dicing tape-on-wafer mounting apparatus 2, taken along a line passing the center of a wafer 1. FIG. 2 (b) is a sectional view of the dicing tape-on-wafer mounting apparatus 2, with a dicing tape 12 being stuck to the wafer 1.

In FIG. 2 (a), the dicing tape-on-wafer mounting apparatus 2 consists mainly of a wafer stage 21, a tape stage 22 and a roller 23. The tape stage 22, which has a flat and ring-shaped dicing frame 22a on its top surface for mounting the dicing tape 12, is coupled to a chamber (not shown) and moves up and down with respect to the wafer stage 21 in a fashion that it encloses the wafer stage 21. The roller 23 moves while rotating on the top surface of the tape stage 22, along a diameter of the tape stage 22.

The wafer stage 21 has a truncated cone-shaped recess (or hole) 21a on its top surface for mounting the wafer 1 therein. The recess 21a is constructed such that the diameters of its upper and lower bases are larger and smaller than that of the wafer 1, respectively and, when the wafer 1 is put in the recess 21a, the top surface of the wafer 1 stands higher than the top surface of the wafer stage 21.

The surface of the roller 23 is made of an elastic member (e.g., silicone rubber) and its length is made larger than the diameter of the wafer 1.

Thus, when the wafer 1 is mounted in the recess 21a coaxially (with the center of the wafer 1 aligned) with the recess 21a, with the wafer surface 1a having the chip circuits 11a fabricated thereon, faced down, the wafer back (shown upward in the Figure) of the wafer 1 comes slightly higher than the top edge 21b of the wafer stage 21.

Next, when the dicing tape 12 is mounted and stuck on the dicing frame 22a via the adhesive 12a while the dicing tape 12 is being pulled with a jig (not shown) to give tension thereto and, as the tape stage 22 is lowered gradually, the dicing tape 12 is mounted onto the wafer back 1b which stands out slightly above the top edge 21b of the wafer stage 21 (see FIG. 2 (b)). Then, when the roller 23 is rolled along the arrow B, the dicing tape 12 is pressed and stuck on the wafer back 1b. Thus, the wafer 1 with the dicing tape 12 stuck thereon is obtained by cutting off the part of the dicing tape 12 protruding the circumference of the wafer 1.

The above-mentioned method is useful in sticking a tape onto a wafer closely when the wafer is flat. However, the latest trend is toward a large-sized and thin wafer in order to improve productivity of semiconductor chips by fabricating as many chips as possible on a larger wafer and to meet the demand for small-sized chips.

Since the wafer 1 is held with the circumference edge of the wafer surface 1a which has chip circuits 11a fabricated, laid on the wafer stage 21, the wafer 1 tends to cave and hang down at its center portion as it becomes larger and thinner. Even if the roller 23 is pressed onto the dicing tape 12 with the wafer 1 at this state, the dicing tape 12 will fail to contact the wafer 1 closely and develop a gap at the center portion, collecting air there and preventing the dicing tape 12 from sticking uniformly and firmly on the wafer back 1b.

Therefore, a problem is that chip elements 11 diced in the dicing process peel off and scatter easily, causing some of them to be lost or damaged due to a collision and, eventually decreasing the productivity of semiconductor devices.

SUMMARY OF THE INVENTION

It is an object of the present invention to provide a dicing tape-on-wafer mounting apparatus and method which can mount a dicing tape uniformly and firmly on a wafer.

It is another object of the present invention to provide a dicing tape-on-wafer mounting apparatus which is economical and small-sized.

To achieve the above and other objects, the present invention provides a wafer stage, a tape stage and a tape pressing tool. The wafer stage mounts the wafer thereon with a wafer surface on which chip circuits are fabricated faced down. The tape stage, which is provided above and aligned with the wafer stage and has a ring whose inside diameter is larger than that of the wafer, mounts the dicing tape on the ring with a tape surface on which adhesives are applied faced down. The tape pressing tool, which is provided above and aligned with the tape stage and has a sheet of an elastic member, presses the tape stage on the wafer stage so that the elastic member presses the dicing tape on the wafer, the elastic member constructed such that vertical force exerted thereby is largest at its center and smaller with the increase in distance from the center.

BRIEF DESCRIPTION OF THE DRAWINGS

Throughout the above-mentioned drawings, identical reference numerals designate the same or similar component parts.

DESCRIPTION OF THE PREFERRED EMBODIMENTS

Figure 3A:
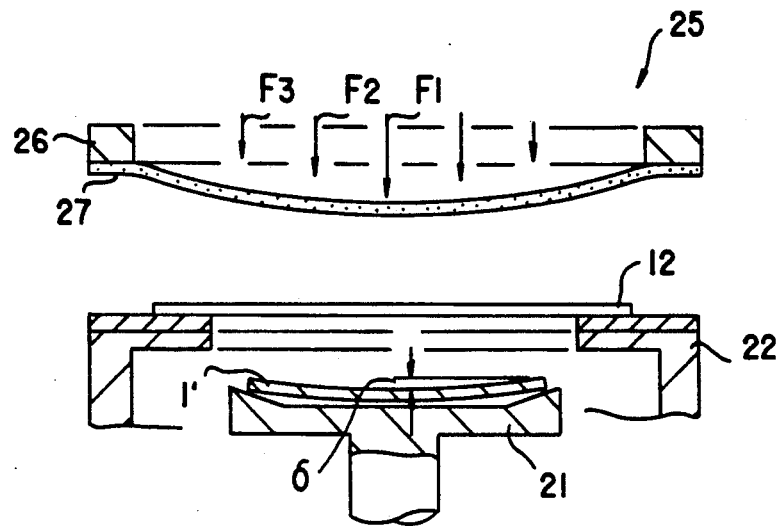
FIG. 3 (a)–(c) are conceptual diagrams illustrating the concept of the present invention.
Figure 3B:
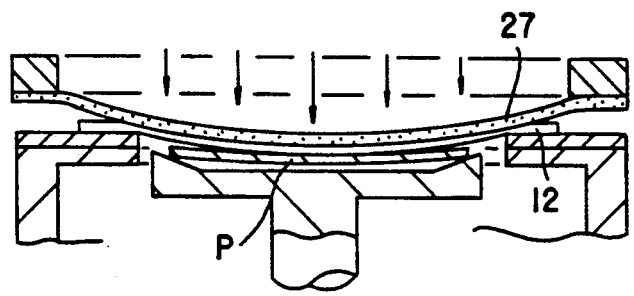
Figure 3C:
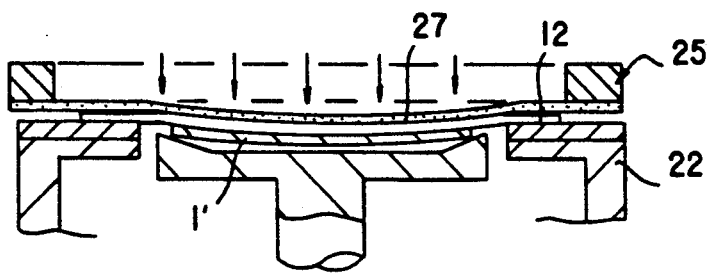

FIGS. 3(a)–(c) are conceptual diagrams illustrating the concept of the present invention, and are cross sectional views of a dicing tape-on-wafer mounting apparatus, each showing a wafer before mounted, in the process of mounting and after mounted on a dicing tape.

Figure 1A:
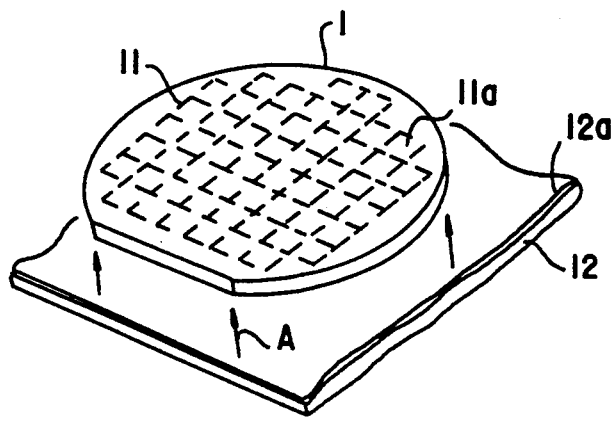
FIG. 1 (a)–(c) illustrate a technical background of the present invention.
Figure 1B:
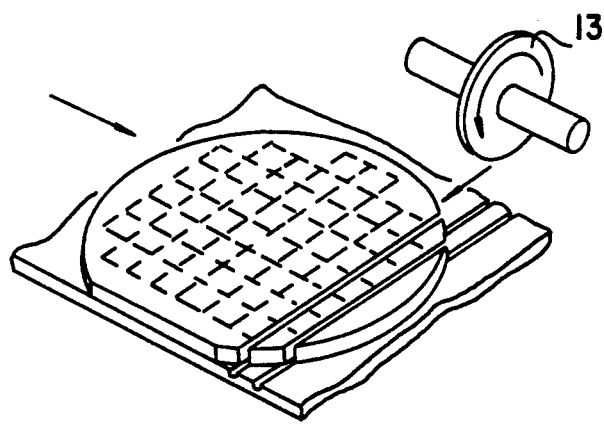
Figure 1C:
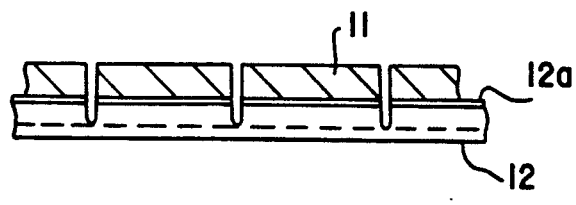
Figure 2A:
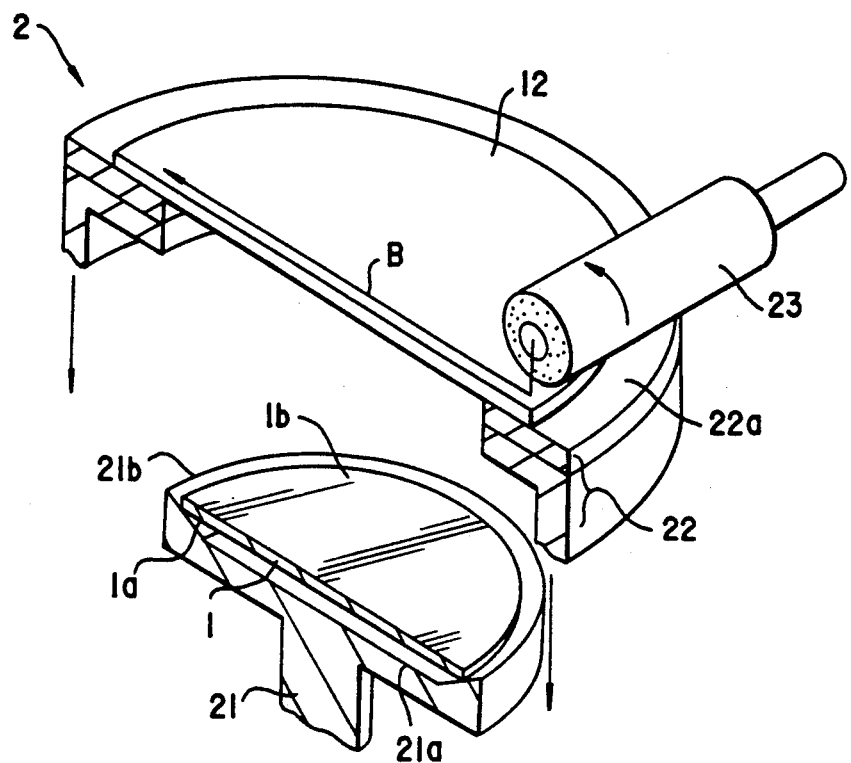
FIG. 2 (a)–(b) show an example of a conventional dicing tape-on-wafer mounting apparatus and method.
Figure 2B:
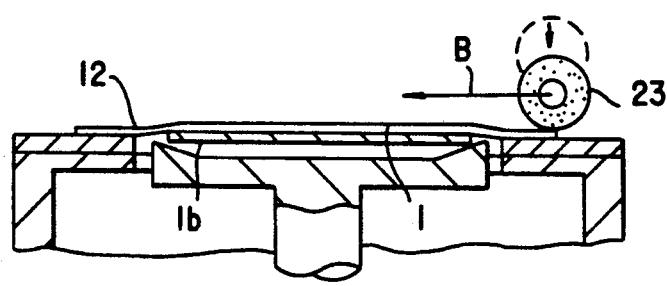

Identical reference numerals used in FIGS. 3(a)–(c) and in FIGS. 2(a)–(b) designate the same or similar component parts.

In FIG. 3(a), the wafer stage 21 and tape stage 22 are those shown in FIGS. 2(a)–(b). A wafer 1', which caves due to its own weight with its center portion hanging down by a distance of δ, is mounted on the wafer stage 21. The dicing tape 12 is mounted on the tape stage 22 while being stretched toward its circumference. A tape pressing tool 25 is provided above and aligned with the tape stage 22.

The tape pressing tool 25 is comprised of a sheet-holding ring 26 and a rubber sheet 27 provided on bottom of the ring 26. The rubber sheet 27 is constructed such that the force it exerts vertically is largest at its center and decreases with the increase in distance from the center toward its circumference, e.g., F1, F2 and F3 in that order and, therefore, it caves naturally with the center hung down to the lowest level.

Lowering the tape pressing tool 25 presses the rubber sheet 27 onto the dicing tape 12 and causes the dicing tape 12 to curve following the shape of the rubber sheet 27. Lowering the tape pressing tool 25 further with the rubber sheet 27 and the dicing tape 12 as they are, causes the lowest point P of the curved dicing tape 12 to touch and stick on the center portion of the wafer 1', as shown in FIG. 3(b).

Then, lowering both the tape pressing tool 25 and tape stage 22 still further causes the dicing tape 12 to touch and stick on the wafer 1' from the center toward the circumference, with the dicing tape 12 sandwiched between the rubber sheet 27 and the curved surface of the wafer 1'. Thus an air bubble or layer is precluded and, therefore, the dicing tape 12 is stuck and mounted uniformly and firmly on the wafer 1', as shown in FIG. 3(c).

Figure 4A:
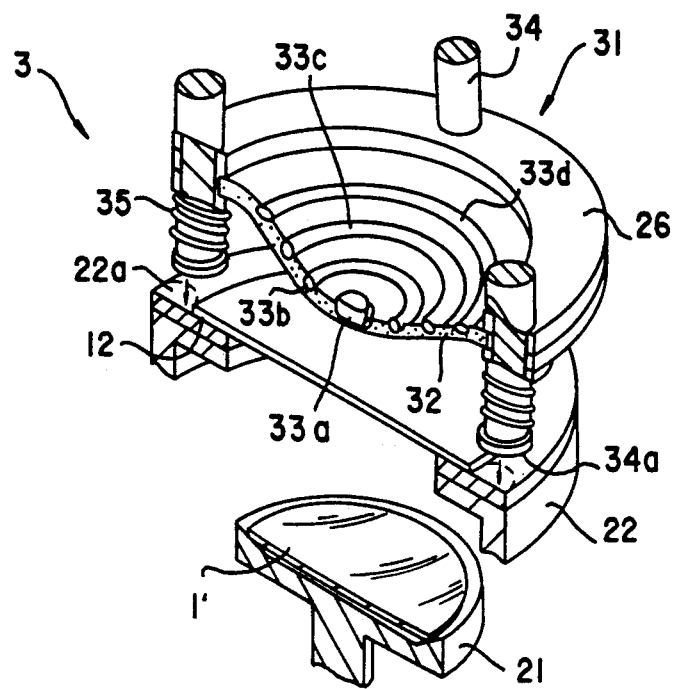
FIG. 4 (a)–(b) show a dicing tape-on-wafer mounting apparatus embodying the present invention.
Figure 4B:
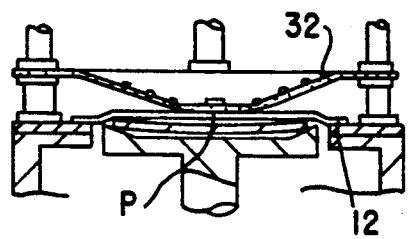

FIGS. 4(a)–(b) show a tape-on-wafer mounting apparatus embodying the present invention.

FIG. 4(a) is a perspective view, in cross section, of a dicing tape-on-wafer mounting apparatus. FIG. 4(b) is a cross sectional view of a dicing tape-on-wafer mounting apparatus.

Identical reference numerals used in FIGS. 4(a)–(b) and in FIGS. 2(a)–(b) designate the same or similar component parts.

A dicing tape-on-wafer mounting apparatus 3 is comprised of the wafer stage 21, tape stage 22 and a tape pressing tool 31. The wafer stage 21 has a truncated cone-shaped recess (or hole) 21a on its top surface for mounting a wafer 1' therein. The recess 21a is constructed such that the diameters of its upper and lower bases are larger and smaller than that of the wafer 1', respectively and, when the wafer 1' is put in the recess 21a, the top surface of the wafer 1' stands higher than the top surface of the wafer stage 21.

The tape stage 22, which has a flat and ring-shaped dicing frame 22a on its top surface for mounting the dicing tape 12, is coupled to a chamber (not shown) and moves up and down with respect to the wafer stage 21 in a fashion that it encloses the wafer stage 21. The wafer 1' which is caved because of its own weight, is mounted on the wafer stage 21, and the dicing tape 12 stretched toward its circumference is mounted on the tape stage 22 and attached to the dicing frame 22a.

The tape pressing tool 31 is comprised of a sheet-holding ring 26 and a rubber sheet 32 provided on bottom of the sheet-holding ring 26. The rubber sheet 32 is provided with a small weight block 33a at its center on the surface and with ring weights 33b, 33c, 33d . . . (three of which are shown in the Figure) arranged coaxially around the weight block 33a, and therefore caves and hangs down naturally.

A plurality of (e.g., four) supports 34 penetrate the sheet-holding ring 26 and each of which has a coil spring 35 wound under the sheet-holding ring 26, so that the tape pressing tool 31 can move vertically along the supports 34 via the coil springs 35. The supports 34 are arranged at equal intervals (three of which are shown in the Figure) and movably coupled to the chamber (not shown) so that they can move vertically along with the tape pressing tool 31.

When both the tape pressing tool 31 and the supports 34 is lowered with the wafer stage 21 and tape stage 22 disposed as shown in FIGS. 3(a)–(c), bottoms 34a of the supports 34 touch the dicing frame 22a. Then, when only the tape pressing tool 31 is lowered against the coil springs 35 using a pressing mechanism (not shown), the lowest point P of the rubber sheet 32 presses the surface of the dicing tape 12.

When the tape pressing tool 31 is further lowered, the state shown in FIG. 3(c) is brought about and the dicing tape 12 sticks and is mounted uniformly on the surface of the wafer 1', even when the wafer 1' is curved and caved. The coil springs 35 helps the tape pressing tool 31, i.e., the rubber sheet 32 provide a uniform pressure on the wafer 1' via the dicing tape 12.

Although, in the above example, the rubber sheet 32 of the tape pressing tool 31 is provided with the weights 33a and 33b-33d in shape of a block and ring, the weights may be in any shapes or constructions. For example, the weights may be of particles with the density highest at the center of the rubber sheet 32 and lower with the increase in distance from the center toward its circumference. The rubber sheet 32 per se may be so constructed that its density (its weight per unit volume) is largest (heaviest) at the center and smaller (lighter) with the increase in distance from the center. Also, the rubber sheet 32 may be so constructed that its density (its weight per unit surface area) is largest (thickest) at the center and smaller (thinner) with the increase in distance from the center.

The inventors have carried out experiments on a wafer of diameter about 8 inches and with the center caved 1 to 2 millimeters deep and obtained a satisfactory result when the rubber sheet 32 is about 2 millimeters thick; the weight 33a is a stainless block of about 5 millimeters cubic; and the weights 33b, 33c, 33d are rings of wire 5 millimeters thick and having diameters about 20, 50, 100 millimeters, respectively.

Since the conventional method presses a dicing tape on a wafer with a roller, it requires a roller long enough and a dicing tape large enough to cover the wafer in order to stick the dicing tape uniformly on a wafer and, eventually, requires a larger dicing tape-on-wafer mounting apparatus, compared with that of the present invention.

As is apparent from the above description, the present invention can provide a dicing tape-on-wafer mounting apparatus and method which can stick a tape uniformly and firmly on a wafer of any size and, therefore, increase the productivity of semiconductor chips. The present invention can also provide a dicing tape-on-wafer mounting apparatus which is small in size.

What is claimed is:

1. A tape-on-wafer mounting apparatus for mounting a dicing tape on a wafer, comprising:
    a wafer stage for mounting the wafer thereon with a wafer surface on which chip circuits are fabricated faced down;
    a tape stage, provided above and aligned with said wafer stage and having a ring whose inside diameter is larger than that of the wafer, for mounting the dicing tape on the ring with a tape surface on which adhesives are applied faced down; and
    a tape pressing tool, provided above and aligned with said tape stage and having a tape presser, for pressing said tape stage on said wafer stage so that the tape presser presses the dicing tape on the wafer, the tape presser made of a sheet of an elastic material and constructed such that vertical force exerted thereby is largest at its center and smaller with the increase in distance from the center.

2. A tape-on-wafer mounting apparatus according to claim 1,
    wherein said tape-on-wafer mounting apparatus is housed in a chamber,
    wherein said wafer stage comprises a hole on its top surface for mounting the wafer, the hole constructed such that, when the wafer is mounted therein, the wafer top surface stands higher than the top surface of said wafer stage,
    wherein said tape stage is movably coupled to the chamber so that said tape stage moves vertically, and
    wherein said tape pressing tool further comprises a holding ring for holding the tape presser; and
    a support, movably coupled to the chamber, for supporting said holding ring so that said holding ring moves vertically.

3. A tape-on-wafer mounting apparatus according to claim 2,
    wherein the support of said tape pressing tool comprises a pillar slidably penetrating said holding ring; and
    a coil spring provided around said pillar and under said holding ring.

4. A tape-on-wafer mounting apparatus according to claim 1 or 2, wherein the tape presser comprises a rubber sheet having a weight block at its center and ring weights arranged coaxially around the weight block.

5. A tape-on-wafer mounting apparatus according to claim 1 or 2, wherein the tape presser comprises a rubber sheet having particles with density highest at its center and lower with the increase in distance from the center.

6. A tape-on-wafer mounting apparatus according to claim 1 or 2, wherein the tape presser comprises a rubber sheet with density highest at its center and lower with the increase in distance from the center.

7. A tape-on-wafer mounting method comprising the steps of:
    mounting a wafer in a hole of a wafer stage with a wafer surface on which chip circuits are fabricated faced down;
    mounting a dicing tape on a ring of a tape stage with a tape surface on which adhesives are applied faced down;
    pressing a tape pressing tool on said tape stage so that a tape presser sticks to the dicing tape, said tape presser provided on said tape pressing tool and made of a sheet of an elastic material and constructed such that vertical force exerted thereby is largest at its center and smaller with the increase in distance from the center; and
    pressing said tape pressing tool and tape stage on said wafer stage so that said tape presser causes the dicing tape to stick to the wafer.

8. A tape-on-wafer mounting method according to claim 7, wherein said tape presser comprises a rubber sheet having a weight block at its center and ring weights arranged coaxially around the weight block.

9. A tape-on-wafer mounting method according to claim 7, wherein said tape presser comprises a rubber sheet having particles with density highest at its center and lower with the increase in distance from the center.

10. A tape-on-wafer mounting method according to claim 7, wherein said tape presser comprises a rubber sheet with density highest at its center and lower with the increase in distance from the center.

* * * * *